(12) United States Patent
Liang et al.

(10) Patent No.: US 10,930,213 B2
(45) Date of Patent: Feb. 23, 2021

(54) LIGHT-EMITTING DEVICE, PIXEL CIRCUIT, METHOD FOR CONTROLLING THE PIXEL CIRCUIT, ARRAY SUBSTRATE, AND DISPLAY DEVICE

(71) Applicants: BOE Technology Group Co., Ltd., Beijing (CN); Chengdu BOE Optoelectronics Technology Co., Ltd., Sichuan (CN)

(72) Inventors: Hengzhen Liang, Beijing (CN); Jia Sun, Beijing (CN)

(73) Assignees: BOE Technology Group Co., Ltd., Beijing (CN); Chengdu BOE Optoelectronics Technology Co., Ltd., Chengdu (CN)

( * ) Notice: Subject to any disclaimer, the term of this patent is extended or adjusted under 35 U.S.C. 154(b) by 122 days.

(21) Appl. No.: 16/147,957

(22) Filed: Oct. 1, 2018

(65) Prior Publication Data
US 2019/0108790 A1 Apr. 11, 2019

(30) Foreign Application Priority Data
Oct. 10, 2017 (CN) .......................... 201710934320.8

(51) Int. Cl.
*H01L 51/52* (2006.01)
*G09G 3/32* (2016.01)
*G09G 3/3241* (2016.01)

(52) U.S. Cl.
CPC ....... *G09G 3/3241* (2013.01); *H01L 51/5209* (2013.01); *H01L 51/5225* (2013.01);
(Continued)

(58) Field of Classification Search
CPC .. G09G 3/3241; G09G 3/3233; G09G 3/3266; G09G 3/3641; G09G 3/3648;
(Continued)

(56) References Cited

U.S. PATENT DOCUMENTS 7,777,698 B2 * 8/2010 Takahara ............... G09G 3/006
345/76
2005/0168491 A1 * 8/2005 Takahara ............. G09G 3/3241
345/690
(Continued)

FOREIGN PATENT DOCUMENTS

CN 104793804 A 7/2015
CN 105609535 A 5/2016
(Continued)

OTHER PUBLICATIONS

Chinese Office Action dated Sep. 16, 2019 for corresponding application CN 201710934320.8.
(Continued)

*Primary Examiner* — Nikolay K Yushin
(74) *Attorney, Agent, or Firm* — Arent Fox LLP; Michael Fainberg

(57) ABSTRACT

The disclosure discloses a light-emitting device, a pixel circuit, a method for controlling the pixel circuit, an array substrate and a display device, where the light-emitting device includes a cathode, an anode and a light-emitting layer, where: the cathode includes a first sub-cathode and a second sub-cathode, both of which are arranged at a same layer; the anode includes a sub-anode and a second sub-anode, both of which are arranged at a same layer; and the light-emitting layer is located between the cathode and the anode.

18 Claims, 4 Drawing Sheets

(52) U.S. Cl.
CPC ......... *G09G 2300/0426* (2013.01); *G09G 2300/0809* (2013.01); *G09G 2320/0233* (2013.01); *G09G 2320/045* (2013.01); *G09G 2320/0626* (2013.01)

(58) Field of Classification Search
CPC ..... G09G 2320/043; G09G 2320/0626; G09G 2300/0809; G09G 2300/0804; G09G 2320/0233; G09G 2320/045; G09G 2300/0426; H01L 51/5225; H01L 51/5209; H01L 51/5262; H01L 51/5281
See application file for complete search history.

(56) References Cited

U.S. PATENT DOCUMENTS

| | | | | |
|---|---|---|---|---|
| 2007/0286944 | A1* | 12/2007 | Yokoyama | H01L 51/5265 427/66 |
| 2017/0108979 | A1 | 4/2017 | Lu et al. | |
| 2018/0046013 | A1 | 2/2018 | Jiang et al. | |

FOREIGN PATENT DOCUMENTS

| | | |
|---|---|---|
| CN | 106782301 A | 5/2017 |
| CN | 106910761 A | 6/2017 |

OTHER PUBLICATIONS

Chinese Office Action dated Oct. 22, 2018 for corresponding application CN 201710934320.8.

* cited by examiner

LIGHT-EMITTING DEVICE, PIXEL CIRCUIT, METHOD FOR CONTROLLING THE PIXEL CIRCUIT, ARRAY SUBSTRATE, AND DISPLAY DEVICE

CROSS-REFERENCE TO RELATED APPLICATION

This Application claims priority to Chinese Patent Application No. 201710934320.8, filed on Oct. 10, 2017, the content of which is incorporated by reference in the entirety.

TECHNICAL FIELD

This disclosure relates to the field of display technologies, and particularly to a light-emitting device, a pixel circuit, a method for controlling the pixel circuit, an array substrate and a display device.

DESCRIPTION OF THE RELATED ART

As the display technologies are advancing, an Organic Light-Emitting Diode (OLED) display has become one of focuses in the field of researches on the existing flat panel displays, and more and more Active Matrix Organic Light-Emitting Diode (AMOLED) display panels have emerged in the market, where an AMOLED display panel has a higher response speed, a higher contrast, and a wider angle of view than a traditional Thin Film Transistor Liquid Crystal Display (TFT LCD) panel.

SUMMARY

Embodiments of the disclosure provide a light-emitting device, a pixel circuit, a method for controlling the pixel circuit, an array substrate and a display device.

In an aspect, the embodiments of the disclosure provide a light-emitting device including: a cathode, an anode and a light-emitting layer, wherein: the cathode includes a first sub-cathode and a second sub-cathode, both of which are arranged at a same layer; the anode includes a sub-anode and a second sub-anode, both of which are arranged at a same layer; and the light-emitting layer is located between the cathode and the anode.

In some embodiments, the first sub-cathode and the first sub-anode are arranged opposite to each other, and the second sub-cathode and the second sub-anode are arranged opposite to each other.

In some embodiments, areas of the first sub-cathode, the second sub-cathode, the first sub-anode, and the second sub-anode are same.

In some embodiments, shapes of the first sub-cathode and the first sub-anode are same; and shapes of the second sub-cathode and the second sub-anode are same.

In some embodiments, the shapes of the first sub-cathode and the second sub-cathode are any one of circles, rectangles, or complementary comb-teeth shapes; and the shapes of the first sub-anode and the second sub-anode are any one of circles, rectangles, or complementary comb-teeth shapes.

In some embodiments, the light-emitting device is an Organic Light-Emitting Diode (OLED).

In another aspect, the embodiments of the disclosure further provide a pixel circuit, including: the light-emitting device according to the embodiments of the disclosure, a drive circuit and a switch circuit, wherein: the drive circuit is configured to drive the light-emitting device to emit light; and the switch circuit is configured to control the light-emitting device to emit light in one of a first light-emitting mode, a second light-emitting mode and a third light-emitting mode.

In some embodiments, the switch circuit includes a first switch element, a second switch element and a third switch element, wherein: a first control terminal of the first switch element is configured to accept an input first control signal, a second control terminal of the first switch element is configured to accept an input second control signal, an input terminal of the first switch element is connected with an output terminal of the drive circuit, a first output terminal of the first switch element is connected with the first sub-anode, and a second output terminal of the first switch element is connected with the second sub-anode; and the first switch element is configured to connect the output terminal of the drive circuit with the first sub-anode under control of the first control signal, and to connect the output terminal of the drive circuit with the second sub-anode under control of the second control signal; a first control terminal of the second switch element is configured to accept an input third control signal, a second control terminal of the second switch element is configured to accept an input fourth control signal, a first input terminal of the second switch element is connected with the first sub-cathode, a second input terminal of the second switch element is connected with the second sub-cathode, and an output terminal of the second switch element is connected with a low-level signal terminal; and the second switch element is configured to connect the first sub-cathode with the low-level signal terminal under control of the third control signal, and to connect the second sub-cathode with the low-level signal terminal under control of the fourth control signal; and a control terminal of the third switch element is configured to accept an input fifth control signal, a first input terminal of the third switch element is connected with the first sub-anode, a first output terminal of the third switch element is connected with the second sub-anode, a second input terminal of the third switch element is connected with the first sub-cathode, and a second output terminal of the third switch element is connected with the second sub-cathode; and the third switch element is configured to connect the first sub-anode with the second sub-anode, and the first sub-cathode with the second sub-cathode, under control of the fifth control signal.

In some embodiments, the first switch element includes a first switch transistor and a second switch transistor, wherein: a gate of the first switch transistor is configured to accept the input first control signal, a first electrode of the first switch transistor is connected with the output terminal of the drive circuit, and a second electrode of the first switch transistor is connected with the first sub-anode; and a gate of the second switch transistor is configured to accept the input second control signal, a first electrode of the second switch transistor is connected with the output terminal of the drive circuit, and a second electrode of the second switch transistor is connected with the second sub-anode.

In some embodiments, the second switch element includes a third switch transistor and a fourth switch transistor, wherein: a gate of the third switch transistor is configured to accept the input third control signal, a first electrode of the third switch transistor is connected with the first sub-cathode, and a second electrode of the third switch transistor is connected with the low-level signal terminal; and a gate of the fourth switch transistor is configured to accept the input fourth control signal, a first electrode of the fourth switch transistor is connected with the second sub-cathode, and a second electrode of the fourth switch transistor is connected with the low-level signal terminal.

In some embodiments, the third switch element includes a fifth switch transistor and a sixth switch transistor, wherein: a gate of the fifth switch transistor is configured to accept the input fifth control signal, a first electrode of the fifth switch transistor is connected with the first sub-anode, and a second electrode of the fifth switch transistor is connected with the second sub-anode; and a gate of the sixth switch transistor is configured to accept the input fifth control signal, a first electrode of the sixth switch transistor is connected with the first sub-cathode, and a second electrode of the sixth switch transistor is connected with the second sub-cathode.

In some embodiments, the drive circuit includes a writing sub-circuit and a drive sub-circuit, wherein: a control terminal of the writing sub-circuit is configured to accept an input scan signal, an input terminal of the writing sub-circuit is configured to accept an input data signal, and an output terminal of the writing sub-circuit is connected with a control terminal of the drive sub-circuit; and the writing sub-circuit is configured to write the data signal to the control terminal of the drive sub-circuit under control of the scan signal; and an input terminal of the drive sub-circuit is configured to accept an input power source signal, and an output terminal of the drive sub-circuit is configured to output drive current for driving the light-emitting device to emit light; and the drive sub-circuit is configured to output the drive current for driving the light-emitting device to emit light, under control of the data signal.

In some embodiments, the writing sub-circuit includes a seventh switch transistor; wherein a gate of the seventh switch transistor is configured to accept the input scan signal, a first electrode of the seventh switch transistor is configured to accept the input data signal, and a second electrode of the seventh switch transistor is connected with the control terminal of the drive sub-circuit; and the drive sub-circuit includes a drive transistor and a capacitor; wherein a gate of the drive transistor is connected with the output terminal of the writing sub-circuit, a first electrode of the drive transistor is configured to accept the input power source signal, and a second electrode of the drive transistor is configured to output the drive current for driving the light-emitting device to emit light; and one terminal of the capacitor is connected with the gate of the drive transistor, and the other terminal of the capacitor is connected with the power source signal.

In some embodiments, the first light-emitting mode is a high brightness light-emitting mode, the second light-emitting mode is an intermediate brightness light-emitting mode, and the third light-emitting mode is a low brightness light-emitting mode.

In yet another aspect, the embodiments of the disclosure further provide another pixel circuit, including: a first switch transistor, a second switch transistor, a third switch transistor, a fourth switch transistor, a fifth switch transistor, a sixth switch transistor, a seventh switch transistor, a drive transistor, a capacitor, and the light-emitting device according to the embodiments of the disclosure, wherein: a gate of the first switch transistor is configured to accept an input first control signal, a first electrode of the first switch transistor is connected with a second electrode of the drive transistor, and a second electrode of the first switch transistor is connected with the first sub-anode of the light-emitting device; a gate of the second switch transistor is configured to accept an input second control signal, a first electrode of the second switch transistor is connected with the second electrode of the drive transistor, and a second electrode of the second switch transistor is connected with the second sub-anode of the light-emitting device; a gate of the third switch transistor is configured to accept an input third control signal, a first electrode of the third switch transistor is connected with the first sub-cathode of the light-emitting device, and a second electrode of the third switch transistor is connected with a low-level signal terminal; a gate of the fourth switch transistor is configured to accept an input fourth control signal, a first electrode of the fourth switch transistor is connected with the second sub-cathode of the light-emitting device, and a second electrode of the fourth switch transistor is connected with the low-level signal terminal; a gate of the fifth switch transistor is configured to accept an input fifth control signal, a first electrode of the fifth switch transistor is connected with the first sub-anode of the light-emitting device, and a second electrode of the fifth switch transistor is connected with the second sub-anode of the light-emitting device; a gate of the sixth switch transistor is configured to accept the input fifth control signal, a first electrode of the sixth switch transistor is connected with the first sub-cathode of the light-emitting device, and a second electrode of the sixth switch transistor is connected with the second sub-cathode of the light-emitting device; a gate of the seventh switch transistor is configured to accept an input scan signal, a first electrode of the seventh switch transistor is configured to accept an input data signal, and a second electrode of the seventh switch transistor is connected with a gate of the drive transistor; a first electrode of the drive transistor is configured to accept an input power source signal, and the second electrode of the drive transistor is configured to output drive current for driving the light-emitting device to emit light; and one terminal of the capacitor is connected with the gate of the drive transistor, and the other terminal of the capacitor is connected with the power source signal.

In still another aspect, the embodiments of the disclosure further provide a method for controlling a pixel circuit according to the embodiments of the disclosure, the method including: connecting, by the first switch element, the output terminal of the drive circuit with the first sub-anode under the control of the first control signal, and/or connecting the output terminal of the drive circuit with the second sub-anode under the control of the second control signal; connecting, by the second switch element, the first sub-cathode with the low-level signal terminal under the control of the third control signal, and/or connecting the second sub-cathode with the low-level signal terminal under the control of the fourth control signal; connecting, by the third switch element, the first sub-anode with the second sub-anode, and the first sub-cathode with the second sub-cathode, under the control of the fifth control signal; and emitting, by the light-emitting device, light in a first light-emitting mode while being driven using drive current output by the drive circuit. or connecting, by the first switch element, the output terminal of the drive circuit with the first sub-anode under the control of the first control signal, and connecting, by the second switch element, the first sub-cathode with the low-level signal terminal under the control of the third control signal; or, connecting, by the first switch element, the output terminal of the drive circuit with the second sub-anode under the control of the second control signal, and connecting, by the second switch element, the second sub-cathode with the low-level signal terminal under the control of the fourth control signal; and emitting, by the light-emitting device, light in a second light-emitting mode while being driven using drive current output by the drive circuit. or connecting, by the first switch element, the output terminal of the drive circuit with the first sub-anode under the control of the first control signal, and connecting, by the second switch element, the first sub-cathode with the low-level signal terminal under the control of the fourth control signal; or, connecting, by the first switch element, the output terminal of the drive circuit with the second sub-anode under the control of the second control signal, and connecting, by the second switch element, the second sub-cathode with the low-level signal terminal under the control of the third control signal; and emitting, by the light-emitting device, light in a third light-emitting mode while being driven using drive current output by the drive circuit.

In some other aspect, the embodiments of the disclosure further provide an array substrate, including the pixel circuit according to the embodiments of the disclosure.

In some other aspect, the embodiments of the disclosure further provide another array substrate, including another pixel circuit according to the embodiments of the disclosure.

In some other aspect, the embodiments of the disclosure further provide a display device, including the array substrate according to the embodiments of the disclosure.

In some other aspect, the embodiments of the disclosure further provide another display device, including another array substrate according to the embodiments of the disclosure.

BRIEF DESCRIPTION OF THE DRAWINGS

In order to make the technical solutions according to the embodiments of the disclosure more apparent, the drawings to which a description of the embodiments refers will be briefly introduced below, and apparently the drawings to be described below are merely illustrative of some of the embodiments of the disclosure, and those ordinarily skilled in the art can derive from these drawings other drawings without any inventive effort.

DETAILED DESCRIPTION OF THE EMBODIMENTS

Figure 1:
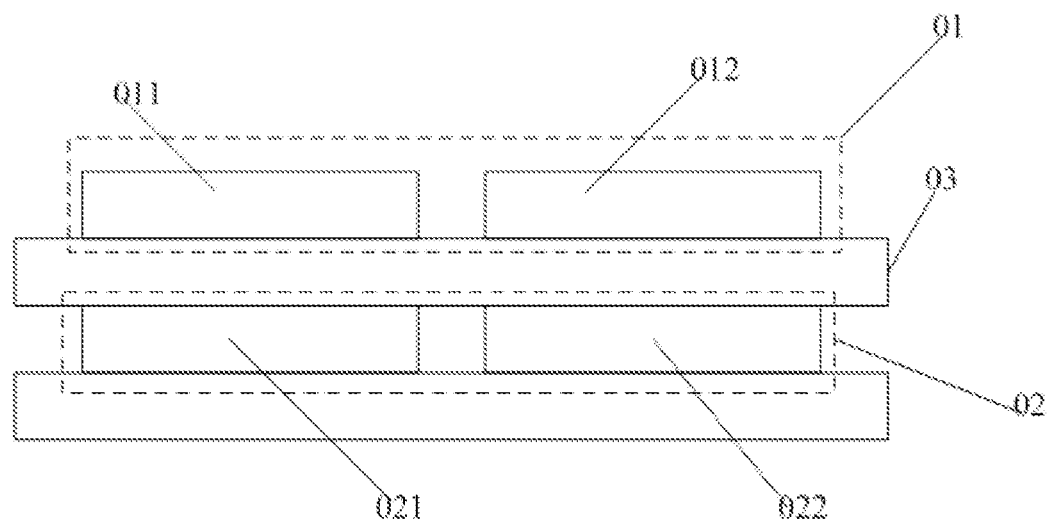
FIG. 1 is a schematic structural diagram of a light-emitting device according to the embodiments of the disclosure.

In the related art, the AMOLED display panel displays an image under the control of current, and since the AMOLED is made of an organic material which may be degraded after being driven for a long period of time, the brightness of the display panel will be lowered, and the service lifetime thereof will be shortened; and also since threshold voltage of a drive transistor for driving an OLED to emit light is drifting, and organic light-emitting materials of organic light-emitting diodes in different colors (e.g., RGB) are degraded at different rates, there will be non-uniform display brightness after the display panel has worked for some period of time. Furthermore the display panel is driven by different current to display different images, so the organic materials will be degraded differently; and if the display panel has been displaying a same image for a long period of time, then the image may be further displayed non-uniformly or an afterimage may occur, that is, the afterimage may be displayed.

Moreover, the display brightness of the AMOLED display panel is determined as a function of the current. Since organic light-emitting layers of the OLEDs are layers with some thicknesses formed through vapor-deposition, it is difficult to control the uniformity of the thicknesses of the layers, thus the thicknesses of the light-emitting layers of the OLEDs in the display panel may be not uniform, which will degrades the display uniformity. Further the film structures of the drive transistors for driving the OLEDs to emit light may also become non-uniform while being fabricated. And while an image is being displayed normally at a high grayscale, the display brightness is so high that it is difficult for human eyes to identify their difference; and while an image is being displayed at a low grayscale, the drive current driving the display panel to display the image is so low that the image displayed on the display panel may be affected by the different layer thicknesses of the drive transistors and the OLEDs, so the human eyes may observe the uniformity of the image displayed on the display panel, and identify some grain-like component of the image, which is blurred at a low grayscale.

Accordingly it is highly desirable for those skilled in the art to address the problems of the non-uniform display and the blurred image displayed at a low grayscale of the display panel.

In order to make the objects, technical solutions, and advantages of the embodiments of the disclosure more apparent, the implementations of a light-emitting device, a pixel circuit, a method for controlling the pixel circuit, an array substrate and a display device according to the embodiments of the disclosure will be described below clearly and fully with reference to the drawings in the embodiments of the disclosure, and apparently the embodiments described below are only a part but not all of the embodiments of the disclosure. Based upon the embodiments here of the disclosure, all the other embodiments which can occur to those skilled in the art without any inventive effort shall fall into the scope of the disclosure.

The embodiments of the disclosure provide a light-emitting device as illustrated in FIG. 1, which includes: a cathode 01, an anode 02, and a light-emitting layer 03; where the cathode 01 includes a first sub-cathode 011 and a second sub-cathode 012, both of which are arranged at the same layer; the anode 02 includes a sub-anode 021 and a second sub-anode 022, both of which are arranged at the same layer; and the light-emitting layer 03 is located between the cathode 01 and the anode 02.

In the light-emitting device above according to the embodiments of the disclosure, the cathode and the anode are divided into two sub-cathodes and two sub-anodes so that light-emitting areas of the light-emitting device can be controlled in such a way that different light-emitting areas of the light-emitting device are driven intermittently to emit light, so that a degradation of the light-emitting layer can be slowed down, and a service lifetime of the light-emitting device can be prolonged. And since the degradation of the light-emitting layer is slowed down, a difference in degrading between light-emitting layers of light-emitting devices in different colors in use can be alleviated to thereby address the problems of non-uniform display and a displayed afterimage arising from the difference in degrading between light-emitting materials in different colors. Furthermore if the light-emitting device is applied to a pixel circuit, then the different light-emitting areas of the light-emitting device will be driven using drive current so that an image can be displayed at different light-emission brightness including high, intermediate, and low light-emission brightness; and the drive current corresponding to the different light-emission brightness can be less different from each other, thus avoiding the problems of non-uniformity and blurring of the image displayed at a low grayscale.

In some embodiments, in the light-emitting device above according to the embodiments of the disclosure, as illustrated in FIG. 1, the first sub-cathode 011 and the first sub-anode 021 are arranged opposite to each other, and the second sub-cathode 012 and the second sub-anode 022 are arranged opposite to each other; where areas of the first sub-cathode, the second sub-cathode, the first sub-anode, and the second sub-anode are same, so that an area of a light-emitting device composed of the first sub-cathode and the first sub-anode is the same as an area of a light-emitting device composed of the second sub-cathode and the second sub-anode.

In some embodiments, shapes of the first sub-cathode and the first sub-anode are same, and shapes of the second sub-cathode and the second sub-anode are same.

Figure 2:
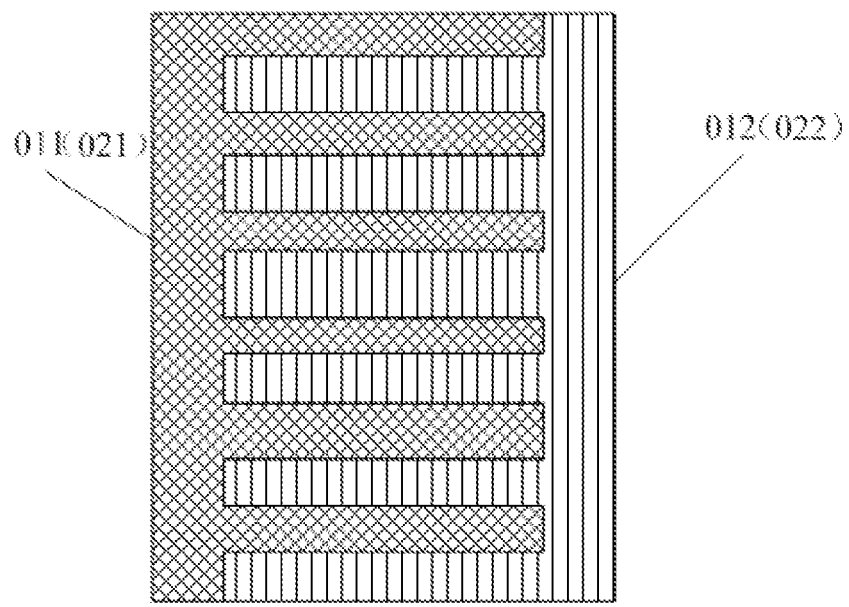
FIG. 2 is a schematic structural diagram of complementary comb-teeth shaped electrodes according to the embodiments of the disclosure.

In some embodiments, in the light-emitting device above according to the embodiments of the disclosure, the shapes of the first sub-cathode 011 and the second sub-cathode 012 are circles, rectangles, or complementary comb-teeth shapes (as illustrated in FIG. 2); and shapes of the first sub-anode 021 and the second sub-anode 022 are circles, rectangles, or complementary comb-teeth shapes (as illustrated in FIG. 2).

In some embodiments, in the light-emitting device above according to the embodiments of the disclosure, both the cathode and the anode include two sub-electrodes (i.e., the first and second sub-cathodes, and the first and second sub-anodes), both the sub-cathodes and the sub-anodes are distributed uniformly in a pixel unit to thereby guarantee display uniformity, and their shapes can be circles, rectangles, complementary comb-teeth shapes, or any other shapes satisfying a design demand, although the embodiments of the disclosure will not be limited thereto.

In some embodiments, the light-emitting device is an OLED.

Figure 3:
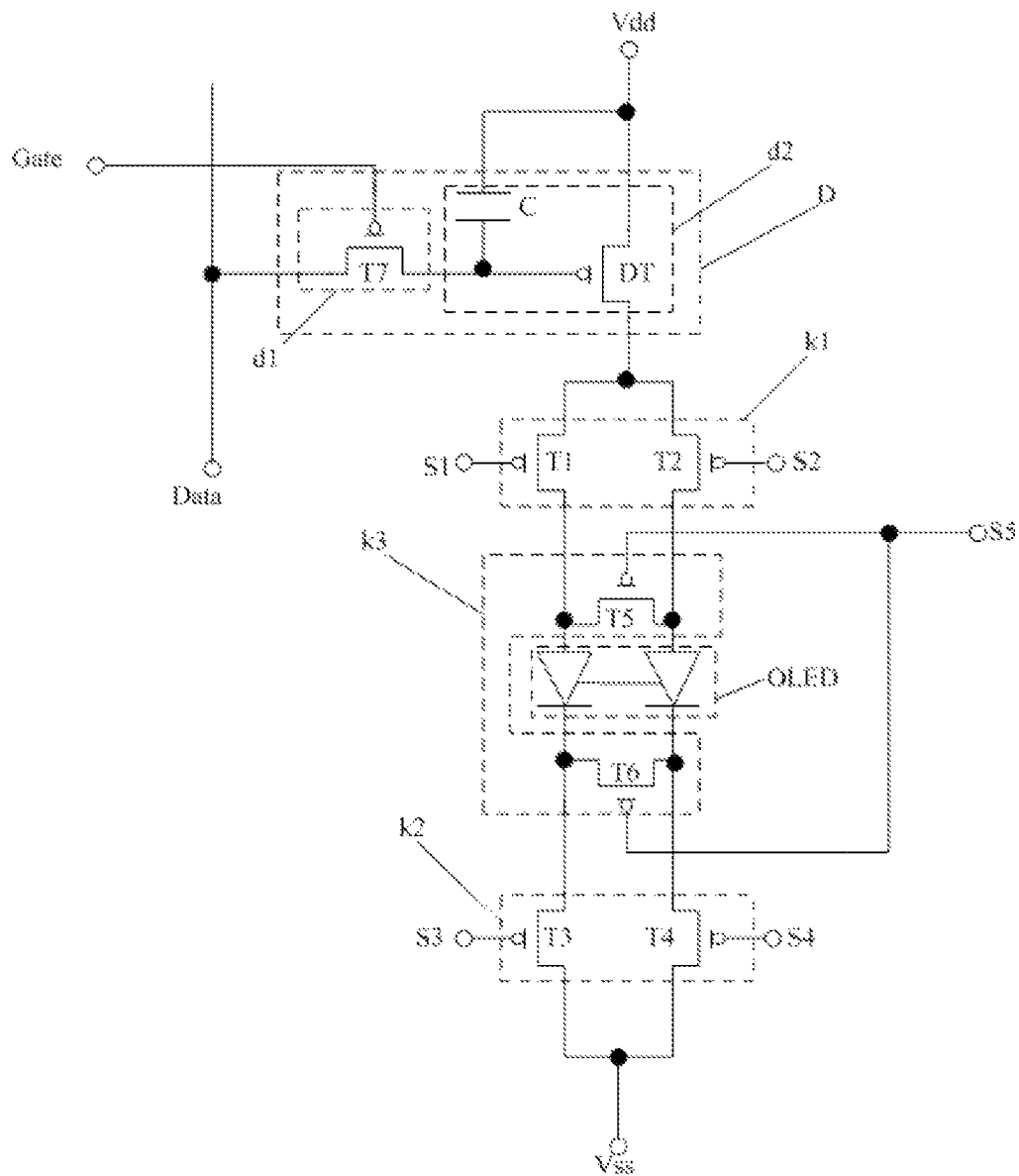
FIG. 3 is a first schematic structural diagram of a pixel circuit according to the embodiments of the disclosure.

Based upon the same inventive concept, the embodiments of the disclosure provide a pixel circuit, as illustrated in FIG. 3, the pixel circuit includes the light-emitting device (which is illustrated by an OLED for example in the FIG. 3) above according to the embodiments of the disclosure, a drive circuit and a switch circuit; where the drive circuit is configured to drive the light-emitting device (i.e. the OLED) to emit light; and the switch circuit is configured to control the light-emitting device (i.e. the OLED) to emit light in one of a first light-emitting mode, a second light-emitting mode and a third light-emitting mode.

In the pixel circuit above according to the embodiments of the disclosure, the switch circuit can control the light-emitting device to emit light in different light-emitting areas, that is, it can control the light-emitting device to emit light in one of the first light-emitting mode, the second light-emitting mode and the third light-emitting mode, where the first light-emitting mode is a high brightness light-emitting mode, the second light-emitting mode is an intermediate brightness light-emitting mode, and the third light-emitting mode is a low brightness light-emitting mode. In this way, corresponding one of the light-emitting modes is enabled so that the different light-emitting areas of the light-emitting device are driven intermittently to emit light, thus greatly slowing down the degradation of the light-emitting device, and prolonging the service lifetime thereof; and since the degradation of the light-emitting device is slowed down, the difference in degrading between organic light-emitting materials of light-emitting devices in different colors in use can be alleviated to thereby address an afterimage arising from the difference in degrading between the light-emitting materials in different colors. Furthermore an image can be displayed at corresponding brightness by enabling different one of the light-emitting modes, but drive current corresponding to the different light-emitting modes can be hardly different from each other, thus avoiding the problems of non-uniformity and blurring of the image displayed at a low gray scale.

In some embodiments, in the pixel circuit above according to the embodiments of the disclosure, as illustrated in FIG. 3, the switch circuit includes: a first switch element k1, a second switch element k2 and a third switch element k3.

A first control terminal of the first switch element k1 is configured to accept an input first control signal S1, a second control terminal of the first switch element k1 is configured to accept an input second control signal S2, an input terminal of the first switch element k1 is connected with an output terminal of the drive circuit D, a first output terminal of the first switch element k1 is connected with the first sub-anode of the light-emitting device (i.e. the OLED), and a second output terminal of the first switch element k1 is connected with the second sub-anode of the light-emitting device (i.e. the OLED); and the first switch element k1 is configured to connect the output terminal of the drive circuit D with the first sub-anode under the control of the first control signal S1, and to connect the output terminal of the drive circuit D with the second sub-anode under the control of the second control signal S2.

A first control terminal of the second switch element k2 is configured to accept an input third control signal S3, a second control terminal of the second switch element k2 is configured to accept an input fourth control signal S4, a first input terminal of the second switch element k2 is connected with the first sub-cathode of the light-emitting device (i.e. the OLED), a second input terminal of the second switch element k2 is connected with the second sub-cathode of the light-emitting device (i.e. the OLED), and an output terminal of the second switch element k2 is connected with a low-level signal terminal Vss; and the second switch element k2 is configured to connect the first sub-cathode with the low-level signal terminal Vss under the control of the third control signal S3, and to connect the second sub-cathode with the low-level signal terminal Vss under the control of the fourth control signal S4.

A control terminal of the third switch element k3 is configured to accept an input fifth control signal S5, a first input terminal of the third switch element k3 is connected with the first sub-anode of the light-emitting device (i.e. the OLED), a first output terminal of the third switch element k3 is connected with the second sub-anode of the light-emitting device (i.e. the OLED), a second input terminal of the third switch element k3 is connected with the first sub-cathode of the light-emitting device (i.e. the OLED), and a second output terminal of the third switch element k3 is connected with the second sub-cathode of the light-emitting device (i.e. the OLED); and the third switch element k3 is configured to connect the first sub-anode with the second sub-anode, and the first sub-cathode with the second sub-cathode, under the control of the fifth control signal S5.

In some embodiments, in the pixel circuit above according to the embodiments of the disclosure, the light-emitting device can be controlled using the first switch element, the second switch element, and the third switch element of the switch circuit to emit light in different light-emitting areas. In this way, corresponding one of the light-emitting modes is enabled so that the different light-emitting areas of the light-emitting device are driven intermittently to emit light, thus greatly slowing down the degradation of the light-emitting device. For example, the first switch element connects the output terminal of the drive circuit with the first sub-anode, and the second switch element connects the first sub-cathode with the low-level signal terminal, so that the light-emitting device can be controlled to emit light in a half of a total light-emitting area. In this way, the different light-emitting areas can be enabled using the switch elements so that the light-emitting device can be controlled to emit light in the different light-emitting areas.

In some embodiments, in the pixel circuit above according to the embodiments of the disclosure, as illustrated in FIG. 3, the first switch element k1 includes a first switch transistor T1 and a second switch transistor T2; where a gate of the first switch transistor T1 is configured to accept the input first control signal S1, a first electrode of the first switch transistor T1 is connected with the output terminal of the drive circuit D, and a second electrode of the first switch transistor T1 is connected with the first sub-anode of the light-emitting device (i.e. the OLED); and a gate of the second switch transistor T2 is configured to accept the input second control signal S2, a first electrode of the second switch transistor T2 is connected with the output terminal of the drive circuit D, and a second electrode of the second switch transistor T2 is connected with the second sub-anode of the light-emitting device (i.e. the OLED). And the first switch transistor can be turned on under the control of the first control signal, so the first switch transistor which is turned on can connect the output terminal of the drive circuit with the first sub-anode of the light-emitting device; and the second switch transistor can be turned on under the control of the second control signal, so the second switch transistor which is turned on can connect the output terminal of the drive circuit with the second sub-anode of the light-emitting device.

In some embodiments, in the pixel circuit above according to the embodiments of the disclosure, as illustrated in FIG. 3, the second switch element k2 includes: a third switch transistor T3 and a fourth switch transistor T4; where a gate of the third switch transistor T3 is configured to accept the input third control signal S3, a first electrode of the third switch transistor T3 is connected with the first sub-cathode of the light-emitting device (i.e. OLED), and a second electrode of the third switch transistor T3 is connected with the low-level signal terminal Vss; and a gate of the fourth switch transistor T4 is configured to accept the input fourth control signal S4, a first electrode of the fourth switch transistor T4 is connected with the second sub-cathode of the light-emitting device (i.e. OLED), and a second electrode of the fourth switch transistor T4 is connected with the low-level signal terminal Vss. And the third switch transistor can be turned on under the control of the third control signal, so the third switch transistor which is turned on can connect the first sub-cathode of the light-emitting device with the low-level signal terminal; and the fourth switch transistor can be turned on under the control of the fourth control signal, so the fourth switch transistor which is turned on can connect the second sub-cathode of the light-emitting device with the low-level signal terminal.

In some embodiments, in the pixel circuit above according to the embodiments of the disclosure, as illustrated in FIG. 3, the third switch element k3 includes: a fifth switch transistor T5 and a sixth switch transistor T6; where a gate of the fifth switch transistor T5 is configured to accept the input fifth control signal S5, a first electrode of the fifth switch transistor T5 is connected with the first sub-anode of the light-emitting device (i.e. OLED), and a second electrode of the fifth switch transistor T5 is connected with the second sub-anode of the light-emitting device (i.e. OLED); and a gate of the sixth switch transistor T6 is configured to accept the input fifth control signal S5, a first electrode of the sixth switch transistor T6 is connected with the first sub-cathode of the light-emitting device (i.e. OLED), and a second electrode of the sixth switch transistor T6 is connected with the second sub-cathode of the light-emitting device (OLED). And the fifth switch transistor can be turned on under the control of the fifth control signal, so the fifth switch transistor which is turned on can connect the first sub-anode of the light-emitting device with the second sub-anode thereof, and the sixth switch transistor can be turned on under the control of the fifth control signal, so the sixth switch transistor which is turned on can connect the first sub-cathode of the light-emitting device with the second sub-cathode thereof.

In some embodiments, in the pixel circuit above according to the embodiments of the disclosure, as illustrated in FIG. 3, the drive circuit D includes: a writing sub-circuit d1 and a drive sub-circuit d2; where a control terminal of the writing sub-circuit d1 is configured to accept an input scan signal Gate, an input terminal of the writing sub-circuit d1 is configured to accept an input data signal Data, and an output terminal of the writing sub-circuit d1 is connected with a control terminal of the drive sub-circuit d2; the writing sub-circuit d1 is configured to write the data signal Data to the control terminal of the drive sub-circuit d2 under the control of the scan signal Gate. An input terminal of the drive sub-circuit d2 is configured to accept an input power source signal Vdd, and an output terminal of the drive sub-circuit d2 is configured to output drive current for driving the light-emitting device to emit light; and the drive sub-circuit d2 is configured to output the drive current for driving the light-emitting device to emit light, under the control of the data signal Data.

In some embodiments, in the pixel circuit above according to the embodiments of the disclosure, as illustrated in FIG. 3, the writing sub-circuit d1 includes a seventh switch transistor T7, where a gate of the seventh switch transistor T7 is configured to accept the input scan signal Gate, a first electrode of the seventh switch transistor T7 is configured to accept the input data signal Data, and a second electrode of the seventh switch transistor T7 is connected with the control terminal of the drive sub-circuit d2. And the seventh switch transistor can be turned on under the control of the scan signal, so the seventh switch transistor which is turned on can output the data signal to the control terminal of the drive sub-circuit.

In some embodiments, in the pixel circuit above according to the embodiments of the disclosure, as illustrated in FIG. 3, the drive sub-circuit d2 includes: a drive transistor DT and a capacitor C, where a gate of the drive transistor DT is connected with the output terminal of the writing sub-circuit d1, a first electrode of the drive transistor DT is configured to accept the input power source signal Vdd, and a second electrode of the drive transistor DT is configured to output the drive current for driving the light-emitting device to emit light; and one terminal of the capacitor C is connected with the gate of the drive transistor DT, and the other terminal of the capacitor C is connected with the power source signal Vdd.

Figure 4:
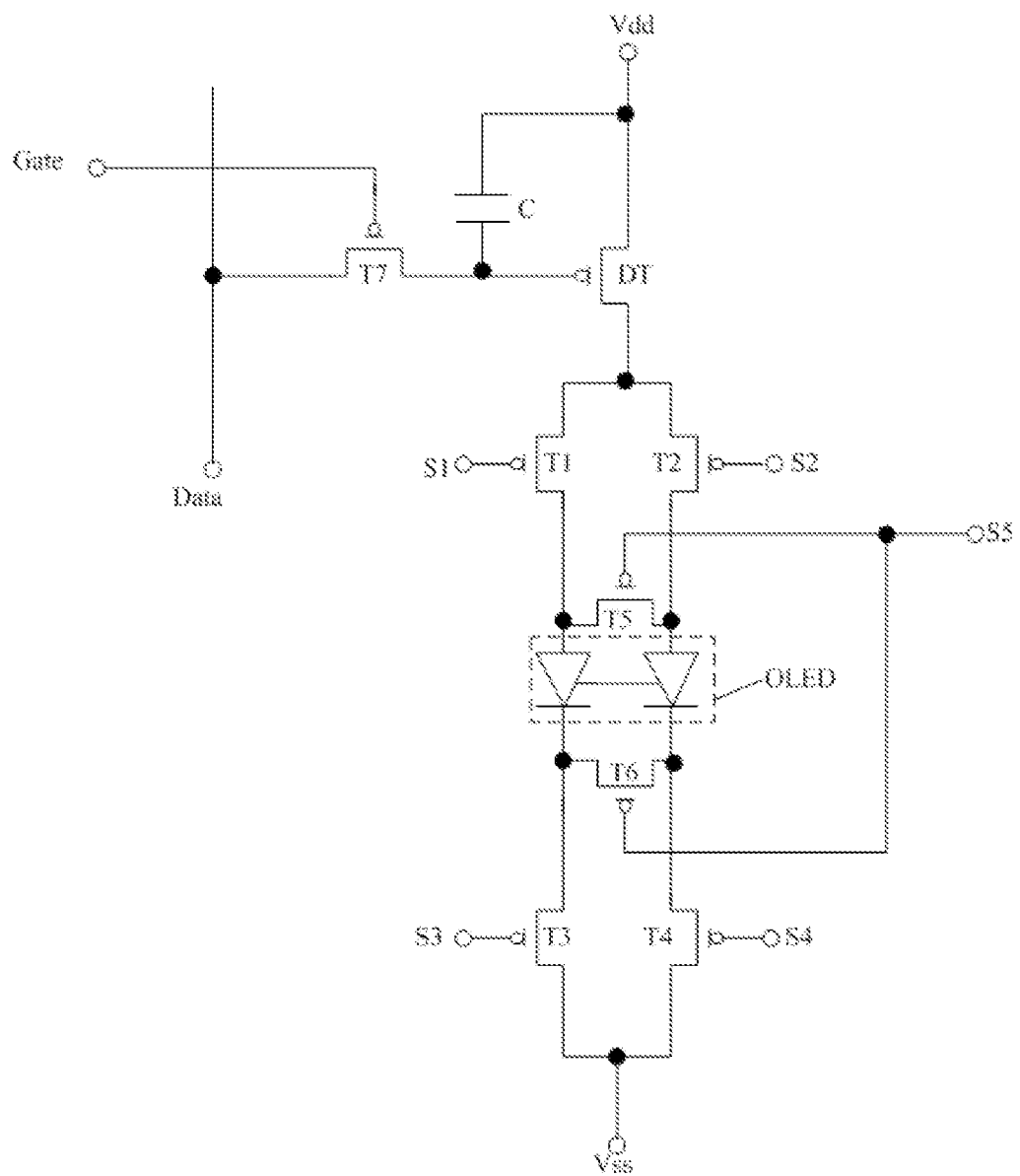
FIG. 4 is a second schematic structural diagram of a pixel circuit according to the embodiments of the disclosure.

Based upon the same inventive concept, the embodiments of the disclosure provide another pixel circuit as illustrated in FIG. 4, the another pixel circuit includes: a first switch transistor T1, a second switch transistor T2, a third switch transistor T3, a fourth switch transistor T4, a fifth switch transistor T5, a sixth switch transistor T6, a seventh switch transistor T7, a drive transistor DT, a capacitor, and the light-emitting device (which is illustrated by an OLED for example in the FIG. 4) above according to the embodiments of the disclosure.

Where a gate of the first switch transistor T1 is configured to accept an input first control signal S1, a first electrode of the first switch transistor T1 is connected with a second electrode of the drive transistor DT, and a second electrode of the first switch transistor T1 is connected with the first sub-anode of the light-emitting device (i.e. the OLED); and a gate of the second switch transistor T2 is configured to accept an input second control signal S2, a first electrode of the second switch transistor T2 is connected with the second electrode of the drive transistor DT, and a second electrode of the second switch transistor T2 is connected with the second sub-anode of the light-emitting device (i.e. the OLED).

A gate of the third switch transistor T3 is configured to accept an input third control signal S3, a first electrode of the third switch transistor T3 is connected with the first sub-cathode of the light-emitting device (i.e. the OLED), and a second electrode of the third switch transistor T3 is connected with a low-level signal terminal Vss; a gate of the fourth switch transistor T4 is configured to accept an input fourth control signal S4, a first electrode of the fourth switch transistor T4 is connected with the second sub-cathode of the light-emitting device (i.e. the OLED), and a second electrode of the fourth switch transistor T4 is connected with the low-level signal terminal Vss.

A gate of the fifth switch transistor T5 is configured to accept an input fifth control signal S5, a first electrode of the fifth switch transistor T5 is connected with the first sub-anode of the light-emitting device (i.e. the OLED), and a second electrode of the fifth switch transistor T5 is connected with the second sub-anode of the light-emitting device (i.e. the OLED); a gate of the sixth switch transistor T6 is configured to accept the input fifth control signal S5, a first electrode of the sixth switch transistor T6 is connected with the first sub-cathode of the light-emitting device (i.e. the OLED), and a second electrode of the sixth switch transistor T6 is connected with the second sub-cathode of the light-emitting device (i.e. the OLED).

A gate of the seventh switch transistor T7 is configured to accept an input scan signal Gate, a first electrode of the seventh switch transistor T7 is configured to accept an input data signal Data, and a second electrode of the seventh switch transistor T7 is connected with a gate of the drive transistor DT; a first electrode of the drive transistor DT is configured to accept an input power source signal Vdd, and the second electrode of the drive transistor DT is configured to output drive current for driving the light-emitting device (i.e. the OLED) to emit light; and one terminal of the capacitor C is connected with the gate of the drive transistor DT, and the other terminal of the capacitor C is connected with the power source signal Vdd.

It shall be noted that, the switch transistors and the drive transistors as referred to in the embodiments above of the disclosure are Thin Film Transistors (TFTs), or Metal Oxide Semiconductor (MOS) field-effect transistors, although the embodiments of the disclosure will not be limited thereto. In an implementation, the first electrodes and the second electrodes of these transistors can be interchanged with each other instead of being distinguished from each other. Further, the switch transistors and the drive transistors have been described as Thin Film Transistors (TFTs) in the embodiments above.

Figure 5:
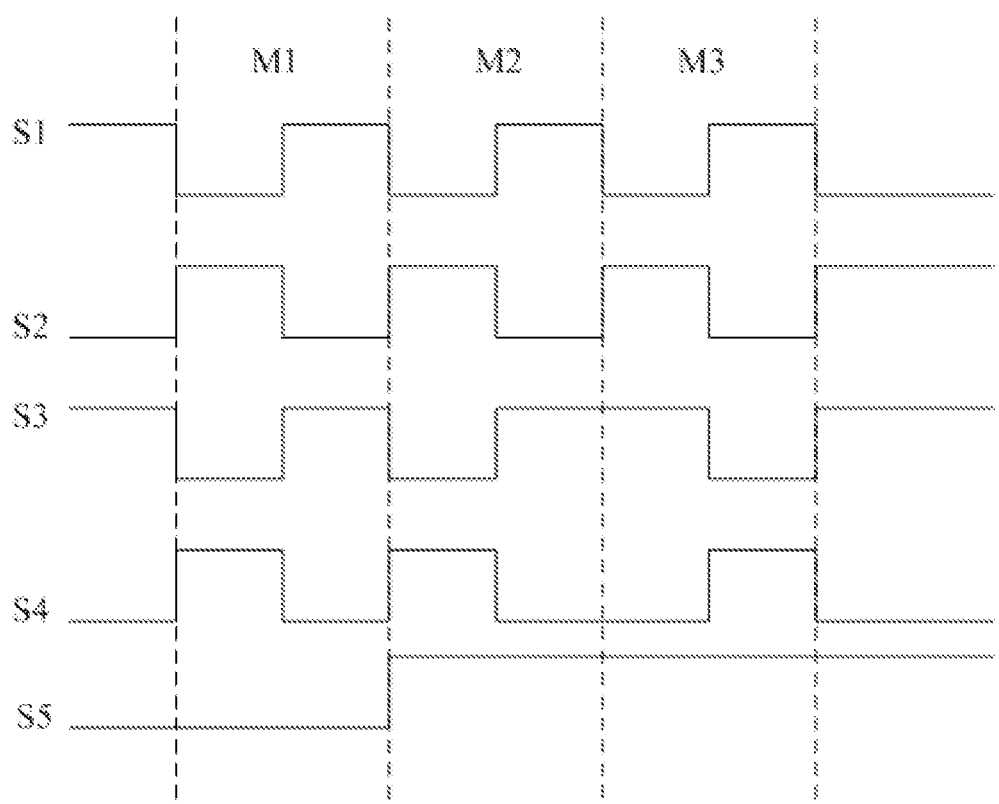
FIG. 5 is a timing control diagram of a pixel circuit according to the embodiments of the disclosure.

An operating process of a pixel circuit according to the embodiments of the disclosure will be described below in details in connection with the pixel circuit according to the embodiments of the disclosure, and timing of the control signals. An operating process of a pixel circuit according to the embodiments of the disclosure will be described in connection with the pixel circuit as illustrated in FIG. 4, and a timing diagram of the control signals as illustrated in FIG. 5. Where in the following description, 1 represents a high-level signal, 0 represents a low-level signal, and the respective transistors in the pixel circuit will be P-type transistors, for example.

With Gate=0, the seventh switch transistor T7 is turned on, so the seventh switch transistor T7 which is turned on outputs the data signal Data to the gate of the drive transistor DT; and the drive transistor DT outputs the drive current for driving the light-emitting device (i.e. the OLED) to emit light, according to the power source signal Vdd under the control of the data signal Data, where the brightness of the light-emitting device is determined as a function of the drive current, and the drive current output by the drive transistor can be controlled as a function of the voltage difference between the data signal Data and the power source signal Vdd.

In the first light-emitting mode M1: S5=0, at least one of S1 and S2 is 0, and at least one of S3 and S4 is 0, so with S5=0, the fifth switch transistor T5 and the sixth switch transistor T6 are turned on; with at least one of S1 and S2 being 0, the first switch transistor T1 and/or the second switch transistor T2 are/is turned on; and with at least one of S3 and S4 being 0, the third switch transistor T3 and/or the fourth switch transistor T4 are/is turned on. In this way, the two sub-cathodes and the two sub-anodes of the light-emitting device are connected together respectively through the fifth switch transistor T5 which is turned on, and the sixth switch transistor T6 which is turned on; the drive current output by the drive transistor DT is output to the first sub-anode or the second sub-anode of the light-emitting device through the first switch transistor T1 or the second switch transistor T2 which is turned on, and the first sub-cathode or the second sub-cathode of the light-emitting device is connected with the low-level signal terminal through the third switch transistor T3 or the fourth switch transistor T4 which is turned on, so that the light-emitting device can be driven by the drive current output by the drive transistor to emit light in the first light-emitting mode with the largest light-emitting area to thereby emit light and display at high brightness.

In the second light-emitting mode M2: S5=1, both S1 and S3 are 0 and both S2 and S4 are 1, or both S1 and S3 are 1 and both S2 and S4 are 0, so with both S1 and S3 being 0, and both S2 and S4 being 1, the first switch transistor T1 and the third switch transistor T3 are turned on, or with both S1 and S3 being 1, and both S2 and S4 being 0, the second switch transistor T2 and the fourth switch transistor T4 are turned on. In this way, the drive current output by the drive transistor DT is output to the first sub-anode of the light-emitting device through the first switch transistor T1 which is turned on, and the first sub-cathode of the light-emitting device is connected with the low-level signal terminal through the third switch transistor T3 which is turned on; or the drive current output by the drive transistor DT is output to the second sub-anode of the light-emitting device through the second switch transistor T2 which is turned on, and the second sub-cathode of the light-emitting device is connected with the low-level signal terminal through the fourth switch transistor T4 which is turned on, so that the light-emitting device can be driven by the drive current output by the drive transistor to emit light in the second light-emitting mode with a half of the total light-emitting area to thereby emit light and display at intermediate brightness.

In the third light-emitting mode M3: S5=1, S1 and S4 are 0 and S2 and S3 are 1, or S2 and S3 are 0 and S1 and S4 are 1, so with S1 and S4 being 0, and S2 and S3 being 1, the first switch transistor T1 and the fourth switch transistor T4 are turned on, or with S2 and S3 being 0, and S1 and S4 being 1, the second switch transistor T2 and the third switch transistor T3 are turned on. In this way, the drive current output by the drive transistor DT is output to the first sub-anode of the light-emitting device through the first switch transistor T1 which is turned on, and the second sub-cathode of the light-emitting device is connected with the low-level signal terminal through the fourth switch transistor T4 which is turned on; or the drive current output by the drive transistor DT is output to the second sub-anode of the light-emitting device through the second switch transistor T2 which is turned on, and the first sub-cathode of the light-emitting device is connected with the low-level signal terminal through the third switch transistor T3 which is turned on, so that the light-emitting device can be driven by the drive current output by the drive transistor to emit light in the third light-emitting mode with a light-emitting area smaller than a half of the total light-emitting area to thereby emit light and display at low brightness.

Based upon the same inventive concept, the embodiments of the disclosure provide an array substrate including the pixel circuit above according to any one of the embodiments of the disclosure. Since the array substrate addresses the problem under a similar principle to the pixel circuit, reference can be made to the implementation of the pixel circuit above for an implementation of the array substrate and a repeated description thereof will be omitted here.

Based upon the same inventive concept, the embodiments of the disclosure further provide a display device including the array substrate according to the embodiments of the disclosure. The display device can be a mobile phone, a tablet computer, a TV set, a monitor, a notebook computer, a digital photo frame, a navigator, or any other product or component with a display function. Since the display device addresses the problem under a similar principle to the array substrate, reference can be made to the implementation of the array substrate above for an implementation of the display device, and a repeated description thereof will be omitted here.

The embodiments of the disclosure provide a light-emitting device, a pixel circuit, a method for driving the pixel circuit, an array substrate and a display device, and the light-emitting device includes: a cathode, an anode and a light-emitting layer, where the cathode includes a first sub-cathode and a second sub-cathode, both of which are arranged at the same layer; the anode includes a sub-anode and a second sub-anode, both of which are arranged at the same layer; and the light-emitting layer is located between the cathode and the anode. In this way, the cathode and the anode are divided into two sub-cathodes and two sub-anodes so that light-emitting areas of the light-emitting device can be controlled in such a way that different light-emitting areas of the light-emitting device are driven intermittently to emit light, so a degradation of the light-emitting layer can be slowed down, and the service lifetime of the light-emitting device can be prolonged; and since the degradation of the light-emitting layer is slowed down, the difference in degrading between light-emitting layers of light-emitting devices in different colors in use can be alleviated to thereby address the problems of non-uniform display and a displayed afterimage arising from the difference in degrading between light-emitting materials in different colors. Furthermore if the light-emitting device is applied to the pixel circuit, then the different light-emitting areas of the light-emitting device will be driven using drive current so that an image can be displayed at different light-emission brightness including high, intermediate, and low light-emission brightness, and the drive current corresponding to the different light-emission brightness can be less different from each other, thus avoiding the problems of non-uniformity and blurring of the image displayed at a low grayscale.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A pixel circuit, comprising: a light-emitting device, a drive circuit and a switch circuit, wherein:
the light-emitting device comprises a cathode, an anode and a light-emitting layer; and
wherein the cathode comprises a first sub-cathode and a second sub-cathode, both of which are arranged at a same layer;
the anode comprises a first sub-anode and a second sub-anode, both of which are arranged at a same layer; and
the light-emitting layer is located between the cathode and the anode;
the drive circuit is configured to drive the light-emitting device to emit light; and
the switch circuit is configured to control the light-emitting device to emit light in one of a first light-emitting mode, a second light-emitting mode and a third light-emitting mode,
wherein the switch circuit comprises: a first switch element, a second switch element and a third switch element, wherein:
a first control terminal of the first switch element is configured to accept an input first control signal, a second control terminal of the first switch element is configured to accept an input second control signal, an input terminal of the first switch element is connected with an output terminal of the drive circuit, a first output terminal of the first switch element is connected with the first sub-anode, and a second output terminal of the first switch element is connected with the second sub-anode; and the first switch element is configured to connect the output terminal of the drive circuit with the first sub-anode under control of the first control signal, and to connect the output terminal of the drive circuit with the second sub-anode under control of the second control signal;
a first control terminal of the second switch element is configured to accept an input third control signal, a second control terminal of the second switch element is configured to accept an input fourth control signal, a first input terminal of the second switch element is connected with the first sub-cathode, a second input terminal of the second switch element is connected with the second sub-cathode, and an output terminal of the second switch element is connected with a low-level signal terminal; and the second switch element is configured to connect the first sub-cathode with the low-level signal terminal under control of the third control signal, and to connect the second sub-cathode with the low-level signal terminal under control of the fourth control signal; and a control terminal of the third switch element is configured to accept an input fifth control signal, a first input terminal of the third switch element is connected with the first sub-anode, a first output terminal of the third switch element is connected with the second sub-anode, a second input terminal of the third switch element is connected with the first sub-cathode, and a second output terminal of the third switch element is connected with the second sub-cathode; and the third switch element is configured to connect the first sub-anode with the second sub-anode, and the first sub-cathode with the second sub-cathode, under control of the fifth control signal.

2. The pixel circuit according to claim 1, wherein the light-emitting device is an Organic Light-Emitting Diode (OLED).

3. The pixel circuit according to claim 1, wherein the first switch element comprises a first switch transistor and a second switch transistor, wherein:
 a gate of the first switch transistor is configured to accept the input first control signal, a first electrode of the first switch transistor is connected with the output terminal of the drive circuit, and a second electrode of the first switch transistor is connected with the first sub-anode; and
 a gate of the second switch transistor is configured to accept the input second control signal, a first electrode of the second switch transistor is connected with the output terminal of the drive circuit, and a second electrode of the second switch transistor is connected with the second sub-anode.

4. The pixel circuit according to claim 1, wherein the second switch element comprises: a third switch transistor and a fourth switch transistor, wherein:
 a gate of the third switch transistor is configured to accept the input third control signal, a first electrode of the third switch transistor is connected with the first sub-cathode, and a second electrode of the third switch transistor is connected with the low-level signal terminal; and
 a gate of the fourth switch transistor is configured to accept the input fourth control signal, a first electrode of the fourth switch transistor is connected with the second sub-cathode, and a second electrode of the fourth switch transistor is connected with the low-level signal terminal.

5. The pixel circuit according to claim 1, wherein the third switch element comprises: a fifth switch transistor and a sixth switch transistor, wherein:
 a gate of the fifth switch transistor is configured to accept the input fifth control signal, a first electrode of the fifth switch transistor is connected with the first sub-anode, and a second electrode of the fifth switch transistor is connected with the second sub-anode; and
 a gate of the sixth switch transistor is configured to accept the input fifth control signal, a first electrode of the sixth switch transistor is connected with the first sub-cathode, and a second electrode of the sixth switch transistor is connected with the second sub-cathode.

6. The pixel circuit according to claim 1, wherein the first light-emitting mode is a high brightness light-emitting mode, the second light-emitting mode is an intermediate brightness light-emitting mode, and the third light-emitting mode is a low brightness light-emitting mode.

7. A method for controlling the pixel circuit according to claim 1, the method comprising:
 connecting, by the first switch element, the output terminal of the drive circuit with the first sub-anode under the control of the first control signal, and/or connecting the output terminal of the drive circuit with the second sub-anode under the control of the second control signal; connecting, by the second switch element, the first sub-cathode with the low-level signal terminal under the control of the third control signal, and/or connecting the second sub-cathode with the low-level signal terminal under the control of the fourth control signal; connecting, by the third switch element, the first sub-anode with the second sub-anode, and the first sub-cathode with the second sub-cathode, under the control of the fifth control signal; and emitting, by the light-emitting device, light in a first light-emitting mode while being driven using drive current output by the drive circuit; or
 connecting, by the first switch element, the output terminal of the drive circuit with the first sub-anode under the control of the first control signal, and connecting, by the second switch element, the first sub-cathode with the low-level signal terminal under the control of the third control signal; or, connecting, by the first switch element, the output terminal of the drive circuit with the second sub-anode under the control of the second control signal, and connecting, by the second switch element, the second sub-cathode with the low-level signal terminal under the control of the fourth control signal; and emitting, by the light-emitting device, light in a second light-emitting mode while being driven using drive current output by the drive circuit; or
 connecting, by the first switch element, the output terminal of the drive circuit with the first sub-anode under the control of the first control signal, and connecting, by the second switch element, the first sub-cathode with the low-level signal terminal under the control of the fourth control signal; or, connecting, by the first switch element, the output terminal of the drive circuit with the second sub-anode under the control of the second control signal, and connecting, by the second switch element, the second sub-cathode with the low-level signal terminal under the control of the third control signal; and emitting, by the light-emitting device, light in a third light-emitting mode while being driven using drive current output by the drive circuit.

8. The pixel circuit according to claim 1, wherein the first sub-cathode and the first sub-anode are arranged opposite to each other, and the second sub-cathode and the second sub-anode are arranged opposite to each other.

9. The pixel circuit according to claim 8, wherein areas of the first sub-cathode, the second sub-cathode, the first sub-anode, and the second sub-anode are same.

10. The pixel circuit according to claim 1, wherein shapes of the first sub-cathode and the first sub-anode are same; and shapes of the second sub-cathode and the second sub-anode are same.

11. The pixel circuit according to claim 10, wherein the shapes of the first sub-cathode and the second sub-cathode are any one of circles, rectangles, or complementary comb-teeth shapes; and the shapes of the first sub-anode and the second sub-anode are any one of circles, rectangles, or complementary comb-teeth shapes.

12. The pixel circuit according to claim 1, wherein the drive circuit comprises: a writing sub-circuit and a drive sub-circuit, wherein:
a control terminal of the writing sub-circuit is configured to accept an input scan signal, an input terminal of the writing sub-circuit is configured to accept an input data signal, and an output terminal of the writing sub-circuit is connected with a control terminal of the drive sub-circuit; and the writing sub-circuit is configured to write the data signal to the control terminal of the drive sub-circuit under control of the scan signal; and
an input terminal of the drive sub-circuit is configured to accept an input power source signal, and an output terminal of the drive sub-circuit is configured to output drive current for driving the light-emitting device to emit light; and the drive sub-circuit is configured to output the drive current for driving the light-emitting device to emit light, under control of the data signal.

13. The pixel circuit according to claim 12, wherein the writing sub-circuit comprises a seventh switch transistor; wherein a gate of the seventh switch transistor is configured to accept the input scan signal, a first electrode of the seventh switch transistor is configured to accept the input data signal, and a second electrode of the seventh switch transistor is connected with the control terminal of the drive sub-circuit; and
the drive sub-circuit comprises a drive transistor and a capacitor; wherein a gate of the drive transistor is connected with the output terminal of the writing sub-circuit, a first electrode of the drive transistor is configured to accept the input power source signal, and a second electrode of the drive transistor is configured to output the drive current for driving the light-emitting device to emit light; and one terminal of the capacitor is connected with the gate of the drive transistor, and the other terminal of the capacitor is connected with the power source signal.

14. An array substrate, comprising the pixel circuit according to claim 1.

15. A display device, comprising the array substrate according to claim 14.

16. A pixel circuit, comprising: a first switch transistor, a second switch transistor, a third switch transistor, a fourth switch transistor, a fifth switch transistor, a sixth switch transistor, a seventh switch transistor, a drive transistor, a capacitor, and a light-emitting device, wherein:
the light-emitting device comprises a cathode, an anode and a light-emitting layer; and
wherein the cathode comprises a first sub-cathode and a second sub-cathode, both of which are arranged at a same layer;
the anode comprises a first sub-anode and a second sub-anode, both of which are arranged at a same layer; and
the light-emitting layer is located between the cathode and the anode;
a gate of the first switch transistor is configured to accept an input first control signal, a first electrode of the first switch transistor is connected with a second electrode of the drive transistor, and a second electrode of the first switch transistor is connected with the first sub-anode of the light-emitting device;
a gate of the second switch transistor is configured to accept an input second control signal, a first electrode of the second switch transistor is connected with the second electrode of the drive transistor, and a second electrode of the second switch transistor is connected with the second sub-anode of the light-emitting device;
a gate of the third switch transistor is configured to accept an input third control signal, a first electrode of the third switch transistor is connected with the first sub-cathode of the light-emitting device, and a second electrode of the third switch transistor is connected with a low-level signal terminal;
a gate of the fourth switch transistor is configured to accept an input fourth control signal, a first electrode of the fourth switch transistor is connected with the second sub-cathode of the light-emitting device, and a second electrode of the fourth switch transistor is connected with the low-level signal terminal;
a gate of the fifth switch transistor is configured to accept an input fifth control signal, a first electrode of the fifth switch transistor is connected with the first sub-anode of the light-emitting device, and a second electrode of the fifth switch transistor is connected with the second sub-anode of the light-emitting device;
a gate of the sixth switch transistor is configured to accept the input fifth control signal, a first electrode of the sixth switch transistor is connected with the first sub-cathode of the light-emitting device, and a second electrode of the sixth switch transistor is connected with the second sub-cathode of the light-emitting device;
a gate of the seventh switch transistor is configured to accept an input scan signal, a first electrode of the seventh switch transistor is configured to accept an input data signal, and a second electrode of the seventh switch transistor is connected with a gate of the drive transistor;
a first electrode of the drive transistor is configured to accept an input power source signal, and the second electrode of the drive transistor is configured to output drive current for driving the light-emitting device to emit light; and
one terminal of the capacitor is connected with the gate of the drive transistor, and the other terminal of the capacitor is connected with the power source signal.

17. An array substrate, comprising the pixel circuit according to claim 16.

18. A display device, comprising the array substrate according to claim 17.

* * * * *